(12) United States Patent  (10) Patent No.: US 8,629,672 B2
Hochlehnert et al.  (45) Date of Patent: Jan. 14, 2014

(54) GENERATOR CIRCUIT BREAKER WITH FIBER-OPTIC CURRENT SENSOR

(75) Inventors: Moritz Hochlehnert, Hohentengen (DE); Thomas Lorek, Windisch (CH); Ahmed Zekhnini, Weinigen (CH); Andreas Frank, Zurich (CH); Klaus Bohnert, Oberrohrdorf (CH)

(73) Assignee: ABB Research Ltd, Zurich (CH)

( * ) Notice: Subject to any disclaimer, the term of this patent is extended or adjusted under 35 U.S.C. 154(b) by 51 days.

(21) Appl. No.: 13/016,693

(22) Filed: Jan. 28, 2011

(65) Prior Publication Data

US 2011/0128655 A1  Jun. 2, 2011

Related U.S. Application Data

(63) Continuation of application No. PCT/EP2008/059984, filed on Jul. 30, 2008.

(51) Int. Cl.
*G01R 31/00* (2006.01)

(52) U.S. Cl.
USPC .......... 324/96; 324/252; 324/244.1; 324/424; 324/117 R; 218/143; 218/134; 218/46; 218/63; 361/116; 361/93.1; 361/612; 361/807

(58) Field of Classification Search
USPC ......................................................... 324/96
See application file for complete search history.

(56) References Cited

U.S. PATENT DOCUMENTS

| | | |
|---|---|---|
| 1,198,018 A | 9/1916 | Fortescue |
| 3,378,731 A | 4/1968 | Whitehead |
| 4,253,061 A | 2/1981 | Ono et al. |
| 4,328,461 A | 5/1982 | Butters et al. |
| 4,542,338 A | 9/1985 | Arditty et al. |
| 4,578,639 A | 3/1986 | Miller |
| 4,742,197 A | 5/1988 | Mauthe |
| 4,797,607 A | 1/1989 | Dupraz |
| 4,894,608 A | 1/1990 | Ulmer, Jr. |
| 4,928,067 A | 5/1990 | Lind |
| 5,063,472 A | 11/1991 | van Doan et al. |
| 5,124,634 A | 6/1992 | Ulmer, Jr. et al. |
| 5,136,236 A | 8/1992 | Bohnert et al. |

(Continued)

FOREIGN PATENT DOCUMENTS

| | | |
|---|---|---|
| DE | 40 25 911 A1 | 4/1991 |
| DE | 44 26 699 A1 | 2/1996 |

(Continued)

OTHER PUBLICATIONS

International Search Report (PCT/ISA/210) for PCT/EP2008/059984 dated Apr. 17, 2009.

(Continued)

*Primary Examiner* — Arleen M Vazquez
*Assistant Examiner* — Thang Le
(74) *Attorney, Agent, or Firm* — Buchanan Ingersoll & Rooney PC (57) ABSTRACT

The current in a generator circuit breaker is measured using the Faraday effect of an optical sensing fiber looped around the breaker's conductor. The sensing fiber is arranged in a sensing strip, which can be mounted to the enclosure of the generator circuit breaker or to the conductor. Exemplary embodiments can have a wide measuring range and can easily be fitted to new or existing generator circuit breakers.

32 Claims, 6 Drawing Sheets

(56) References Cited

U.S. PATENT DOCUMENTS

| | | | |
|---|---|---|---|
| 5,202,812 A | | 4/1993 | Shinoda et al. |
| 5,295,207 A | | 3/1994 | Dupraz et al. |
| 5,600,550 A | | 2/1997 | Cook, II |
| 5,645,622 A | * | 7/1997 | Cronk et al. ............... 65/378 |
| 5,844,410 A | * | 12/1998 | Ikuta et al. ............... 324/96 |
| 5,933,000 A | * | 8/1999 | Bosselmann et al. ......... 324/96 |
| 5,935,292 A | * | 8/1999 | Hernandez et al. ........... 65/504 |
| 5,953,121 A | * | 9/1999 | Bohnert et al. ............... 356/481 |
| 6,167,180 A | * | 12/2000 | Keller ............... 385/113 |
| 6,175,167 B1 | | 1/2001 | Lorenz et al. |
| 6,389,211 B1 | * | 5/2002 | Mandry et al. ............... 385/135 |
| 6,433,981 B1 | | 8/2002 | Fletcher et al. |
| 6,522,256 B2 | | 2/2003 | Panto et al. |
| 6,608,481 B1 | * | 8/2003 | Piazza et al. ............... 324/424 |
| 6,636,321 B2 | | 10/2003 | Bohnert |
| 6,731,115 B2 | | 5/2004 | Saitoh |
| 6,734,657 B2 | | 5/2004 | Bohnert et al. |
| 7,339,680 B2 | | 3/2008 | Bohnert et al. |
| 7,450,792 B2 | | 11/2008 | Bohnert et al. |
| 7,723,977 B2 | | 5/2010 | Blake et al. |
| 8,222,556 B2 | * | 7/2012 | Akesson et al. ............... 218/143 |
| 2001/0010452 A1 | | 8/2001 | Moriarty |
| 2002/0000802 A1 | | 1/2002 | Panto et al. |
| 2002/0053911 A1 | * | 5/2002 | Saitoh ............... 324/424 |
| 2002/0180416 A1 | * | 12/2002 | Dyott ............... 324/96 |
| 2005/0083033 A1 | | 4/2005 | Kurosawa et al. |
| 2005/0088662 A1 | | 4/2005 | Bohnert et al. |
| 2006/0153509 A1 | | 7/2006 | Bohnert et al. |
| 2007/0041568 A1 | | 2/2007 | Ghoshal et al. |
| 2007/0052971 A1 | | 3/2007 | Bohnert et al. |
| 2007/0116403 A1 | | 5/2007 | Blemel |
| 2008/0143111 A1 | * | 6/2008 | Ichinose et al. ............... 290/44 |
| 2008/0205832 A1 | * | 8/2008 | Cook ............... 385/113 |
| 2008/0303510 A1 | | 12/2008 | Blake et al. |
| 2011/0062944 A1 | | 3/2011 | Sørensen |

FOREIGN PATENT DOCUMENTS

| | | |
|---|---|---|
| DE | 196 08 285 A1 | 8/1997 |
| DE | 10005164 A1 | 8/2001 |
| EP | 0 156 533 | 10/1985 |
| EP | 0 156 533 A1 | 10/1985 |
| EP | 0 237 776 A2 | 9/1987 |
| EP | 596566 A2 | 5/1994 |
| EP | 0 785 439 A | 7/1997 |
| EP | 1 115 000 A2 | 7/2001 |
| EP | 1 154 278 A2 | 11/2001 |
| EP | 1 512 981 A1 | 3/2005 |
| EP | 1 624 311 | 2/2006 |
| EP | 1 624 311 A1 | 2/2006 |
| EP | 1 710 589 A1 | 10/2006 |
| FR | 2 680 919 | 3/1993 |
| FR | 2 680 919 A1 | 3/1993 |
| JP | 61-034469 A | 2/1986 |
| JP | 61-202172 A | 9/1986 |
| JP | 07-107746 A | 4/1995 |
| JP | 07-174792 A | 7/1995 |
| JP | 07-234252 A | 9/1995 |
| JP | 09-196974 A | 7/1997 |
| JP | 10-227814 | 8/1998 |
| JP | 10-227814 A | 8/1998 |
| JP | 2002-303643 A | 10/2002 |
| JP | 2007-537424 A | 12/2007 |
| JP | 2008-113516 A | 5/2008 |
| WO | WO 2005/111633 A1 | 11/2005 |

OTHER PUBLICATIONS

Written Opinion (PCT/ISA/237) for PCT/EP2008/059984 dated Apr. 17, 2009.

K. Bohnert et al., "Temperature and vibration insensitive fiber-optic current sensor", J. of Lightwave Technology, Feb. 2002, pp. 267-276, vol. 20, No. 2.

K. Bohnert et al., "Highly accurate fiber-optic dc current sensor for the electro-winning industry", IEEE/IAS Transactions on Industry Applications, Jan./Feb. 2007, vol. 43, No. 1, pp. 180-187.

R. A. Bergh et al., "An overview of fiber-optic gyroscopes", J. Lightw. Technol., Apr. 1984, vol. LT-2, No. 2, pp. 91-107.

H. Lefevre, "The fiber-optic gyroscope", Artech House, Boston, London, 1993 (10 pages).

R. I. Laming et al., "Electric current sensors employing spun highly birefringent optical fibers", J. Lightw. Technol., Dec. 1989, pp. 2084-2094, vol. 7, No. 12.

K. Bohnert et al., "Fiber-optic high current sensor for electrowinning of metals", Journal of Lightwave Technology, Nov. 2007, pp. 3602-3609, vol. 25, No. 11.

K. Kurosawa et al., "Polarization properties of flint glass fiber", J. Lightw. Technol., Jul. 1995, pp. 1378-1383, vol. 13, No. 7.

Asplund, "Ultra High Voltage Transmission" Energy Efficient Grids, ABB Review, Feb. 2007, pp. 23-27.

Fernqvist, "The Measurement Challenge of the LHC Project" IEEE Transaction on Instrumentation and Measurement, (1999), vol. 48, No. 2, pp. 462-466.

International Search Report (Form PCT/ISA/210) and the Written Opinion of the International Searching Authority (Form PCT/ISA/237) dated Jan. 28, 2009, issued in the corresponding European Patent International Application No. PCT/EP2008/059983.

Office Action dated Aug. 21, 2012, issued in corresponding Japanese Patent Application No. 2011-520328. (3 pages).

International Search Report (Form PCT/ISA/210) and the Written Opinion of the International Searching Authority (Form PCT/ISA/237) dated Jan. 28, 2009, issued in corresponding International Application No. PCT/EP2008/059983. (10 pages).

Asplund, "Ultra High Voltage Transmission Alternative Scenarios for Long Distance Bulk Power Transmission—800kV and HVDC and 1000kV HVAC" Energy Efficient Grids, ABB Review, (Feb. 2007), pp. 23-27.

Fernqvist, "The Measurement Challenge of the LHC Project" IEEE Transactions on Instrumentation and Measurement, (Apr. 1999), vol. 48, No. 2, pp. 462-466.

Office Action issued Jan. 7, 2013 in related U.S. Appl. No. 13/014,969.

Siemans, High voltage Direct Current Transmission—Proven Technology for Power Exchange: http://web.archive.org/web/20070217073457/http://www.ewh.ieee.org/r6/san_francisco/pes/pes_pdf/HVDC_Technology.pdf.

Bohnert et al., Highly Accurate Fiber-Optic DC Current Sensor for the Electrowinning Industry, IEEE Transactions on Industry Applications, vol. 43, No. 1, Jan. 2007, p. 180.

U.S. Office Action issued on Jun. 20, 2013 in corresponding U.S. Appl. No. 13/014,969.

* cited by examiner

GENERATOR CIRCUIT BREAKER WITH FIBER-OPTIC CURRENT SENSOR

RELATED APPLICATION

This application claims priority as a continuation application under 35 U.S.C. §120 to PCT/EP2008/059984 filed as an International Application on Jul. 30, 2008 designating the U.S., the entire content of which is hereby incorporated by reference in its entirety.

FIELD

The disclosure relates to a generator circuit breaker which can be arranged between an electrical generator and a transformer, and having a current sensor. The disclosure also relates to an assembly having an electrical generator, a transformer and such a circuit breaker.

BACKGROUND INFORMATION

Electrical generators can generate a first AC voltage on the order of some kilovolts and are connected to a transformer that transforms the first voltage to a higher second voltage, which can be in the order of, for example, some 100 kilovolts. In many applications, a circuit breaker, the so-called "generator circuit breaker" (GCB), is arranged between the generator and the transformer.

Up to now, current measurement within a GCB is realized through an inductive current transformer. The primary winding is represented by the current-carrying path of the GCB. The secondary part of the current transformer has an iron core and windings configured according to a desired transmission ratio. The primary current generates magnetic flux in the iron core and thereby a current in the secondary winding.

An exemplary covered current range of the GCB extends from 0 A to 300 kA, for which reason different cores are used to fulfill either protection or measuring purposes. This is because cores designed for high currents do not have sufficient accuracy at lower current ranges. Cores designed for relatively low currents will be saturated by high primary currents, such that the transformer becomes non-linear for high currents.

Known current transformers can be relatively heavy due to their iron core. Therefore, a crane is used for mounting the current transformer to the front side of the GCB.

As a result of customer demands concerning transmission ratio, weight, accuracy class and protection class, a large variety of current transformers exists, which makes standardization impossible.

WO 2005/111633 discloses a concept for the stress-free packaging and orientation of the sensing fiber of a fiber-optic current sensor, such as for the precise measurement of high direct currents at aluminum smelters.

SUMMARY

A generator circuit breaker for being arranged between an electrical generator and a transformer, the generator circuit breaker comprising: a conductor for carrying current of a generator; a switch for interrupting said current; and at least one current sensor for measuring a current in said conductor, wherein said current sensor includes an optical sensing fiber looped around said conductor, and an optoelectronic module for measuring said current in said sensing fiber via a Faraday effect; and a shock absorber to which the sensing fiber is mounted for absorbing shock when the switch is operated.

BRIEF DESCRIPTION OF THE DRAWINGS

The disclosure will be better understood and features in addition to those set forth above will become apparent when consideration is given to the following detailed description of exemplary embodiments. Such description makes reference to the annexed drawings, wherein.

DETAILED DESCRIPTION

Exemplary embodiments are directed to current measurement in generator circuit breakers.

In an exemplary embodiment, a GCB is equipped with a current sensor comprising an optical fiber looped around the conductor of the GCB and an optoelectronic module for measuring a current-dependent optical phase shift due to the Faraday Effect in the fiber.

Exemplary embodiments can provide advantages over known current measurement based on a measurement transformer. For example, exemplary embodiments can be lightweight, have a wide measuring range and allow a large degree of standardization for a wide field of current ranges.

A low birefringent sensing fiber can, for example, be in the current sensor.

The fiber can be packaged in a capillary, such as fused silica, and the capillary can be mounted on or in a flexible carrier strip (e.g., of fiber reinforced epoxy). The carrier strip can be mounted to the enclosure of the GCB, or it can be mounted to the current-carrying conductor, for example where the GCB is operated without an enclosure.

The optoelectronics module of the sensor can, for example, be located in the GCB control cubicle.

Figure 1:
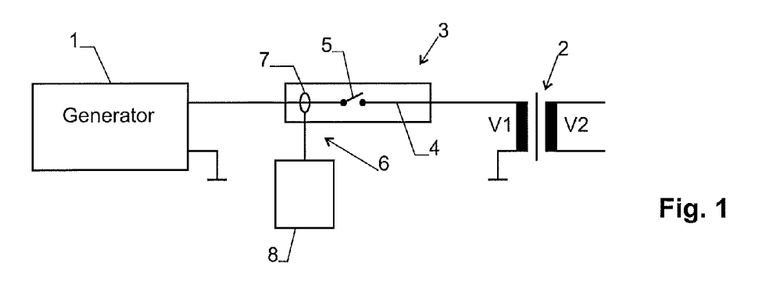
FIG. 1 shows an exemplary assembly of a generator, a transformer and a GCB with current sensor.

FIG. 1 shows a basic set-up of an exemplary assembly having an electrical generator 1 generating a first AC voltage V1 of e.g. some kilovolts and a transformer 2 that converts voltage V1 from generator 1 to a second voltage V2 of e.g. some 100 kilovolts. Interposed in the line between generator 1 and transformer 2 is a generator circuit breaker (GCB) 3. GCB 3 comprises a conductor 4 for carrying the non-ground current from generator 1 to transformer 2 and a switch 5 for interrupting the current. Further, it is equipped with a current sensor 6 for measuring the current in conductor 4.

Current sensor 6 is formed by an optical sensing fiber 7 looped around conductor 4 as well as an optoelectronic module 8 for measuring the current in conductor 4 by means of the Faraday effect in sensing fiber 7.

Current Sensor:

As mentioned above, the current sensor makes use of the magneto-optic effect (Faraday effect) in fiber 7. An exemplary sensor version is an interferometric sensor as illustrated in FIG. 2 and described in Refs. 1-4.

The optoelectronic module 8 comprises a light source 10 the light of which is depolarized in a depolarizer 11, subsequently sent through a fiber coupler 12 to a polarizing phase modulator 13. Polarizing phase modulator 13 splits the light up into two paths, sends one of them through a 90° splice 14 and combines them back in a polarization-maintaining fiber coupler 15. The two resulting linearly polarized light waves with orthogonal polarization directions are sent through a polarization maintaining (pm) connecting fiber 16. A short section of pm fiber (e.g. an elliptical-core fiber) serves as a quarter-wave retarder 17 and converts the linearly polarized waves into left and right circularly polarized waves. The circular waves propagate through sensing fiber 7, are reflected at a reflector 18 at its far end and then return with swapped polarizations. The retarder 17 converts the circular waves back to orthogonal linear waves. The magnetic field of the current produces a differential phase shift $\Delta\phi$ between left and right circularly polarized light waves. The returning linear waves have the same phase shift $\Delta\phi$. $\Delta\phi$ is proportional to the current. The phase shift $\Delta\phi$ is detected by a technique as known from fiber gyroscopes (Ref. 5, 6).

Figure 2:
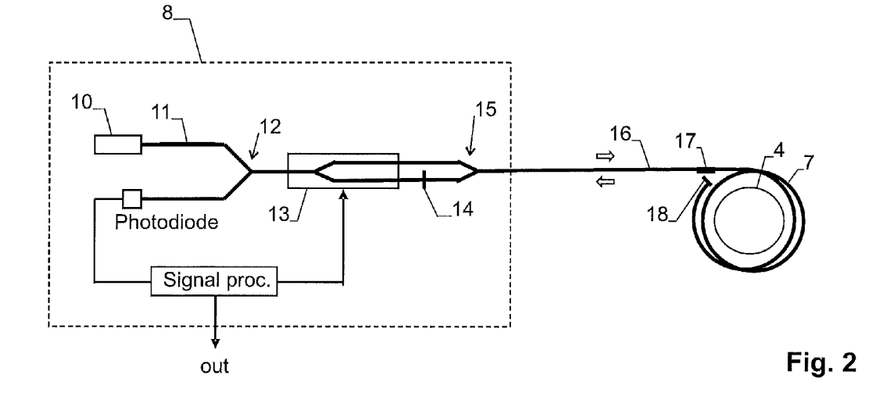
FIG. 2 shows an exemplary optoelectronic current sensor.

Exemplary embodiments are not restricted to interferometric fiber-optic current sensors as shown in FIG. 2, but may be used as well for others, such as polarimetric sensors. In a polarimetric sensor the magneto-optic effect is detected as a rotation of a linearly polarized light wave.

Figure 3:
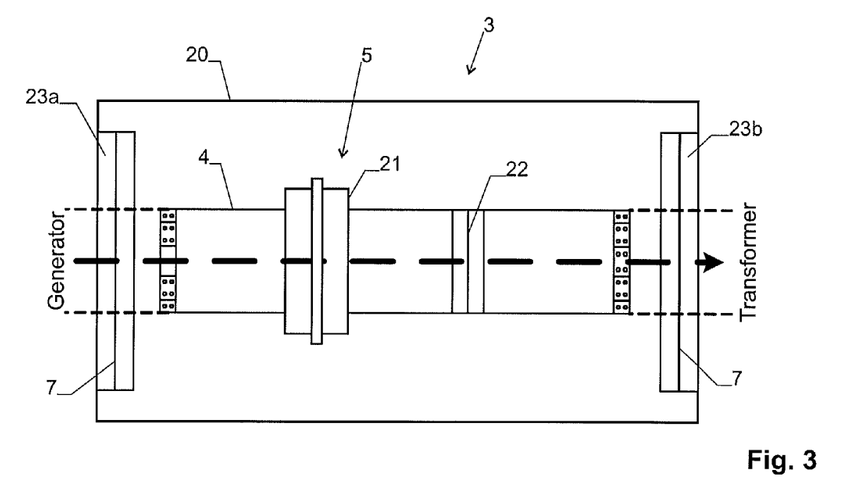
FIG. 3 is a schematic view of an exemplary GCB with two possible locations for the fiber.

Sensing Fiber Placement:

The fiber-optic sensor head with sensing fiber 7 can be installed at the same location within the GCB as a known current transformer, as shown in FIG. 3, or it can be directly mounted to current carrying parts within the GCB 3.

FIG. 3 shows a sectional view of GCB 3 having an enclosure 20 in substantially concentric manner around an axial conductor 4. Switch 5 is mounted in an SF6 interrupting chamber 21 and comprises a disconnector 22. Devices of this type are known to those skilled in the art.

The sensor head with sensing fiber 7 is mounted to the enclosure 20 of the GCB with an adequate fixture made of plastics or metal, by screws to the holes provided in enclosure 20. One or more shock absorbers (not shown in FIG. 3) can be placed between the sensor head and the enclosure to protect the sensor head against hard shocks (e.g., emerging during switching operations of the GCB).

FIG. 3 shows two alternative mounting positions 23a, 23b at the input and the output ends of GCB 3, respectively.

Mounting sensing fiber 7 to enclosure 20, which is at ground potential, has following exemplary advantages:

The sensor head and thus the fiber cable for connecting fiber 16 between the head and the optoelectronic module 8 are at ground potential. Therefore, no high-voltage proof cable or insulator pole is needed.

Peak temperatures are relatively modest.

The sensor can be mounted without interfering with the GCB assembly.

A retrofit installation is possible.

As can be seen from FIG. 3, sensing fiber 7 can, for example, be advantageously mounted to the inner side of enclosure 20.

Mounting a sensing fiber 7 inside enclosure 20 can be advantageous because this arrangement can make the measured signal independent of any electrical currents through enclosure 20.

Figure 5:
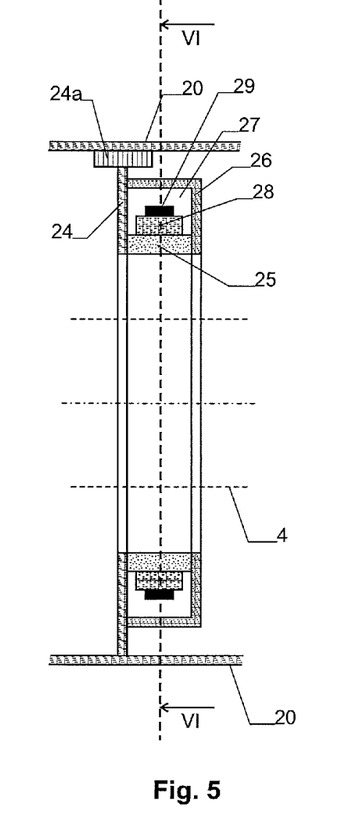
FIG. 5 is a sectional view, perpendicular to the current axis of the GCB.
Figure 6:
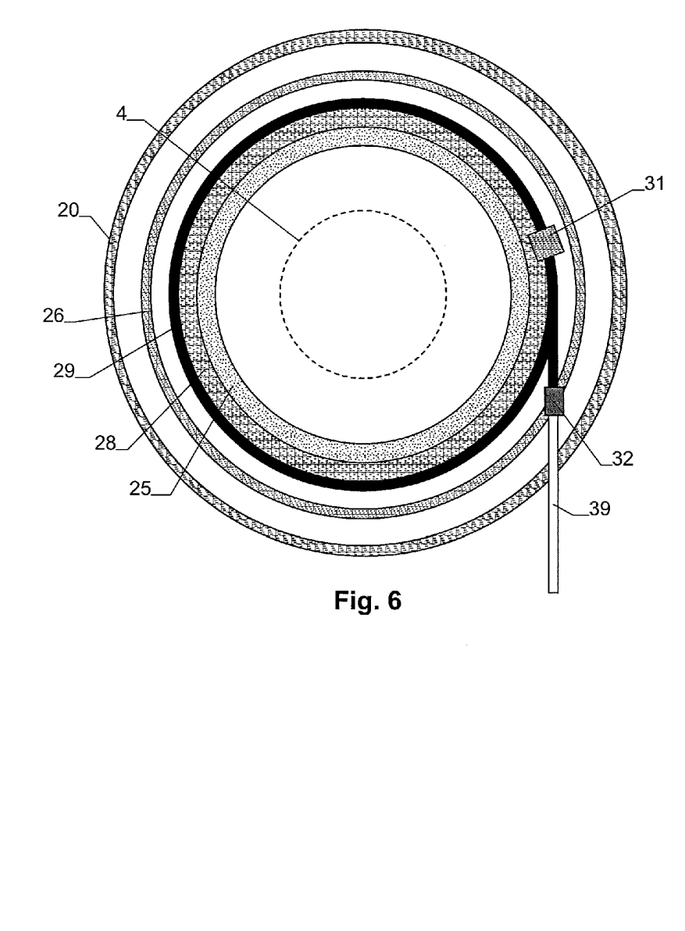
FIG. 6 is a sectional view along line VI-VI of FIG. 5.

FIGS. 5 and 6 show a possible embodiment for mounting sensing fiber 7 to the inside of enclosure 20. As can be seen, an inward projecting flange 24 is mounted via a coupling 24a to enclosure 20 (not necessarily round shape, it can also have rectangular shape) and carries a support body 25 and a cover 26 to form an annular channel 27. Support body 25 is cylindrical and extends parallel to enclosure 20. In channel 27, a foam strip 28 is mounted to support body 25 and in turn carries a sensing strip 29. As described below, sensing fiber 7 is arranged in sensing strip 29.

Coupling 24a can be designed such that it has shock absorbing properties (e.g., by allowing slight axial motions of flange 24). Coupling 24a and/or foam strip 28 form the shock absorber mentioned above.

Support body 25 and/or cover 26 may be integral parts of flange 24 or separate parts attached thereto by gluing, screwing and so forth.

As can be seen in FIG. 6, at least one clamp 31 is provided for holding sensing strip 29 in place and, for example, for fixing the positions of the start and end of the sensing strip. Further, an adapter 32 is mounted inside enclosure 20 for connecting sensing strip 29 to the fiber cable 39 of connecting fiber 16.

Figure 10:
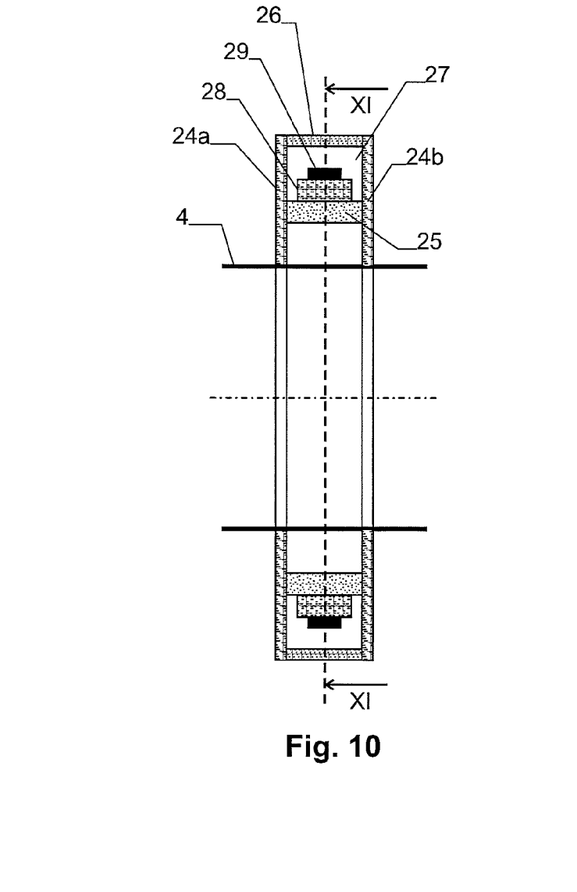
FIG. 10 is a sectional view, perpendicular to the current axis, of a second exemplary embodiment of a GCB.
Figure 11:
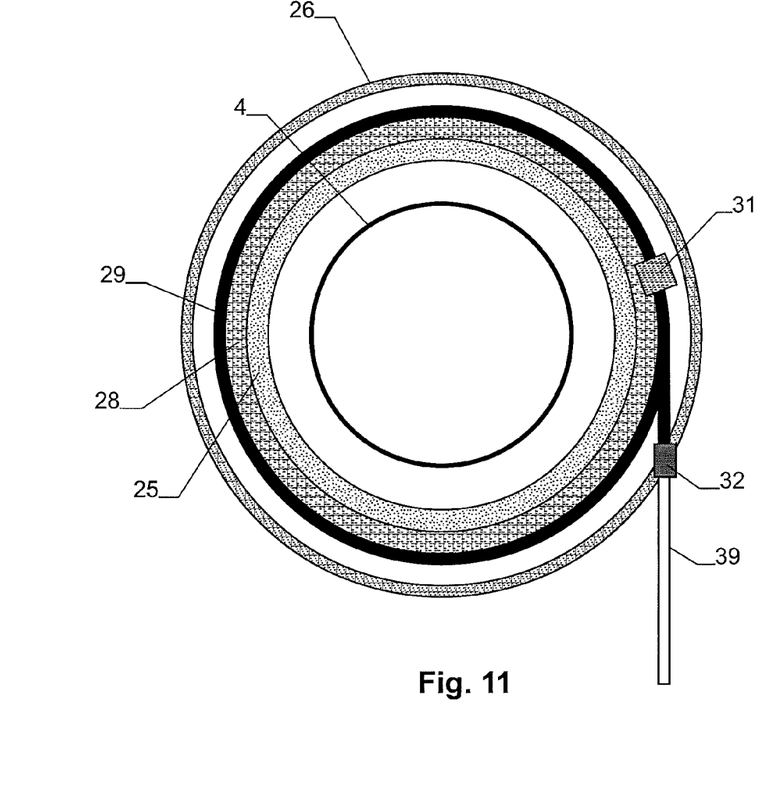
FIG. 11 is a sectional view along line XI-XI of FIG. 10.

FIGS. 10 and 11 show an alternative exemplary embodiment where sensing fiber 7 in sensing strip 29 is mounted to an outer side of conductor 4. In this embodiment, a pair of flanges 24a, 24b extends outwards from conductor 4 with support body 25 and cover 26 extending between them for forming channel 27. Foam strip 28 is again mounted to support body 25 and carries sensing fiber 29. Fiber cable 39 of connecting fiber 16 should be high-voltage proof. In the vicinity of the high voltage parts the cable may be equipped with sheds to increase the creep distance along fiber cable 39 as known from high voltage signal cables.

Optoelectronic Module Placement:

Optoelectronic module 8 including the light source 10, the signal detection and processing unit as well as interface electronics is, for example, located in the GCB control cubicle, such as near the GCB 3. A fiber cable protects the connecting fiber 16 between the sensor head 7 and the electronics 8. For example, the connecting fiber 16 has an optical connector so that the sensor head 7 and electronics 8 can be separated (e.g., during transport and installation).

Sensor Head Design:

a) Low Birefringent Sensing Fiber

Figure 4:
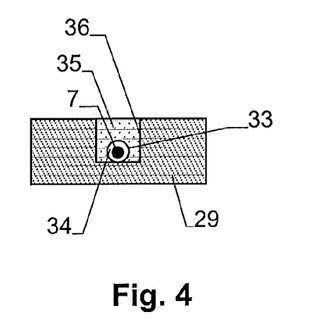
FIG. 4 is a sectional view of an exemplary carrier strip with a fiber.

As mentioned above, sensing fiber 7 can, for example, be advantageously packaged in a flexible sensing strip 29, for example of fiber re-enforced epoxy resin, as disclosed in Ref. 1 and as shown in FIG. 4 of the present application. The bare sensing fiber 7 (without coating) and retarder 17 are accommodated in a thin fused silica capillary 33, as described in Ref. 8. Capillary 33 is coated for protection (e.g., with a thin polyimide coating) and is filled with a lubricant 34 to avoid friction between the fiber and the capillary walls. The capillary is embedded in silicone or a resin 35 in a groove 36 of sensing strip 29. Groove 36 may, for example, be of rectangular or triangular shape. For example, the longitudinal capillary axis is in the neutral plane of sensing strip 29 (at half the thickness of the strip) so that bending the strip does not strain the capillary.

This way of fiber packaging avoids any packaging related stress on the fiber over a wide range of temperatures and results in high stability and accuracy of the sensor. Sensing strip 29 serves as a robust mechanical protection of the capillary and also ensures a reproducible azimuth angle of retarder 17 and the fiber, a further prerequisite for high scale factor repeatability, see Ref. 1 and Ref. 9. For example, a defined azimuth angle can be desirable if the orientation of retarder 17 deviates from 90°. Such a deviation may be the result of manufacturing tolerances or may be introduced on purpose, here for temperature compensation of the Faraday effect (see below).

Sensing fiber 7 forms an integral number of loops around conductor 4 to ensure that the sensor measures a closed path integral of the magnetic field. The signal is thus independent of the magnetic field distribution and unaffected by currents flowing outside the fiber coil. In order to properly close the sensing strip, the strip has markers or similar separated by the length of the sensing fiber. For example, the markers are at or near the sensing fiber ends. The sensing strip is mounted on the annular support body 25 in such a way that the markers coincide (e.g., such that they are at the same circumferential position). Clamp 31 keeps the overlapping strip sections in place. Foam strip 28 may be inserted between the sensing strip 29 and the main support body 25 to avoid stress as a result of differential thermal expansion. Foam strip 28 also serves to absorb mechanical shock and vibration.

Figure 7:
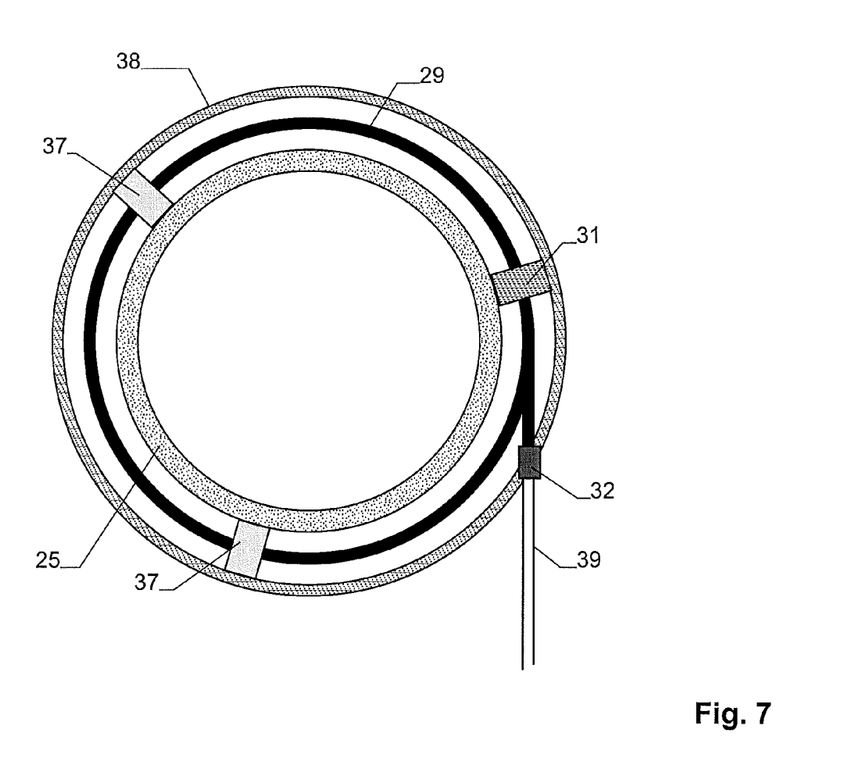
FIG. 7 is a sectional view of a second exemplary embodiment of the GCB.

Alternatively, and as shown in FIG. 7, sensing strip 29 may be essentially (e.g., substantially) loose and supported only at some locations by a plurality of spaced-apart, radially extending support members 37, one of which can be clamp 31, with clamp 31 being used to close the loop at the markers mentioned above. The support members 37 hold sensing fiber 7 in sensing strip 29 suspended at a distance from support body 25.

In addition, an annular cover ring 38 can be provided coaxially to and at a distance from support body 25 with the support members 37 extending between them. Sensing fiber 7 in sensing strip 29 can be located between support body 25 and cover ring 38 for improved mechanical protection.

The sensing head of FIG. 7 can either be mounted to enclosure 20 or conductor 4 of GCB 3.

In an exemplary embodiment, the cable/sensing strip adapter 32 that connects the cable 39 of connecting fiber 16 is mounted to the cover ring 38 or cover 26 so that it also acts as strain relief for the cable 39.

Support body 25 and cover ring 38 or cover 26 may each include (e.g., consist of) several parts that can be added or retrofitted after the assembly of the GCB. Support body 25 may, as mentioned above, be mounted to the GCB 3 by means of shock-absorbing parts to further reduce exposure of the sensing strip 29 to shock and vibration.

Figure 8:
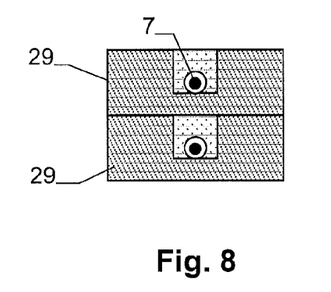
FIG. 8 is a sectional view of an exemplary sensing strip having two windings.

At high rated currents a single fiber loop may be already sufficient. If more loops are desired, sensing strip 29 may be mounted in two or more superimposed loops as shown in FIG. 8, where sensing strip 29 holds a single sensing fiber 7, which has substantially the same length as sensing strip 29, and sensing strip 29 is wound several times around conductor 4.

Figure 9:
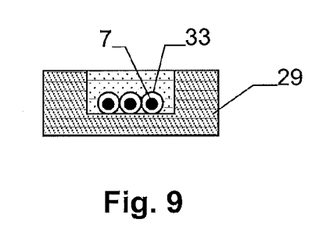
FIG. 9 is a sectional view of an exemplary sensing strip with several embedded fiber windings.

Alternatively, the sensor may have only one loop of sensing strip 29 containing several loops of capillary 33 with sensing fiber 7 inside, as shown in FIG. 9. Here, it can be ensured that the sensing fiber length is an integer multiple of the perimeter length of the sensing strip.

The temperature dependence of the Faraday effect (Verdet constant, $7 \times 10^{-5}$ °C.$^{-1}$) can, for example, be inherently compensated as described in Ref. 10 and Ref. 3. Here, retarder 17 in front of sensing fiber 7 is prepared such that it introduces an extra contribution to the temperature dependence which compensates the temperature dependence of the Verdet constant. However, a further contribution to the temperature dependence of the sensor arises from the fact that the thermal expansion of sensing strip 29 (typically about $10^{-5}$ °C.$^{-1}$) is larger than the thermal expansion of sensing fiber 7 ($0.5 \times 10^{-6}$ °C.$^{-1}$). As a result, the fiber coil is perfectly closed (i.e. the ends of the sensing fiber are at the same radial position) only at a certain temperature, such as at room temperature. As the fiber in capillary 33 does not follow the thermal expansion of the sensing strip 29, the fiber ends overlap somewhat below room temperature whereas a small tangential gap develops between the ends above room temperature. An overlap slightly increases the sensitivity of the sensor, whereas a gap slightly reduces the sensitivity. The effect thus is opposite to the temperature dependence of the Verdet constant. The combined temperature dependence is then $6 \times 10^{-5}$ °C.$^{-1}$, if the thermal expansion of the sensing strip 29 is $10^{-5}$ °C.$^{-1}$. Retarder 17 is, for example, prepared such that it compensates the combined temperature dependence (e.g., retarder 17 is set such that its influence corresponds to $-6 \times 10^{-5}$ °C.$^{-1}$).

Figure 12:
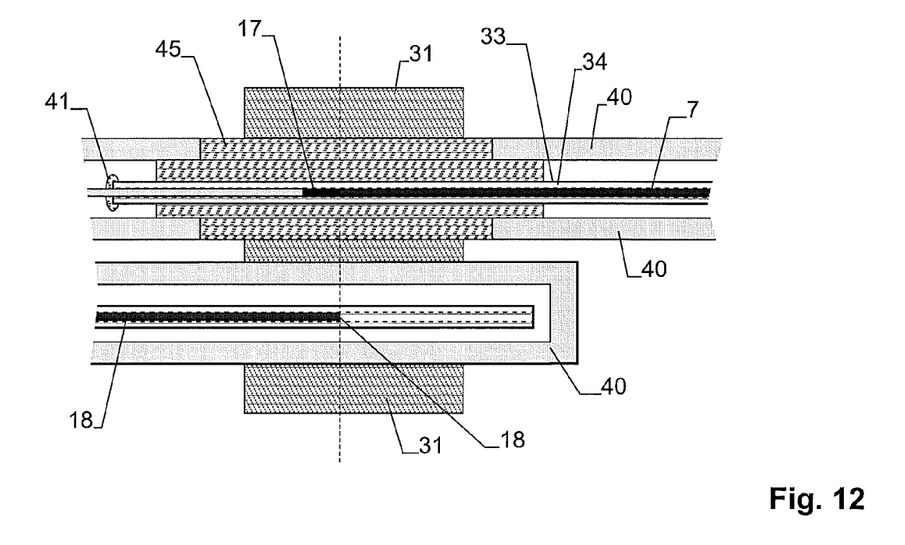
FIG. 12 is a sectional view through an exemplary clamp and adapter of an alternative design.

As an alternative to the epoxy strip the sensing strip can also be formed by an appropriate hollow-tube fiber cable 40 as shown in FIG. 12, which shows a radial section of such a sensor head in the region of clamp 31. Fiber cable 40 is again equipped with markers and/or clamps which allow to reproducibly close the fiber coil.

The coil may again include (e.g., consist of) one or several loops. If a reproducible retarder/fiber azimuth angle is desired, capillary 33 at or near the location of retarder 17 is mounted in an appropriate adapter tube 45. A seal 41 at the capillary ends ensures that the fiber 7 follows any adapter tube and capillary rotation. Clamp 31 closing the loop also defines the proper fiber azimuth.

FIG. 12 shows, in its upper half, the start section of the coil of cable 40 and, in its lower half, the end section of cable 40 after one loop. As can be seen, both are commonly held in clamp 31.

b) Spun Highly Birefringent Sensing Fiber

Instead of a fiber with low intrinsic birefringence the fiber may be a spun highly birefringent fiber as known from Ref. 7. This type of fiber is more stress tolerant then a low birefringent fiber and therefore may be embedded into the fiber-reinforced epoxy strip or protected in a fiber cable without a capillary. Alternatively, it may be embedded in a capillary in the same way as the low birefringent fiber described above.

c) Flint Glass Fiber

A further alternative is the use of flint glass fiber (Ref. 11). Flint glass fiber has very small stress optic coefficients and therefore is also rather stress tolerant. Like the spun highly birefringent fiber it may be embedded into the fiber-reinforced epoxy strip or protected in a fiber cable without a capillary.

d) Annealed Sensing Fiber

At small loop diameters (e.g. loop diameters of less than 40-60 cm) or if a larger number of fiber loops is used the fiber may be thermally annealed as described in Ref. 3. In this case the fiber coil can be packed in a rigid ring-shaped housing.

Figure 13:
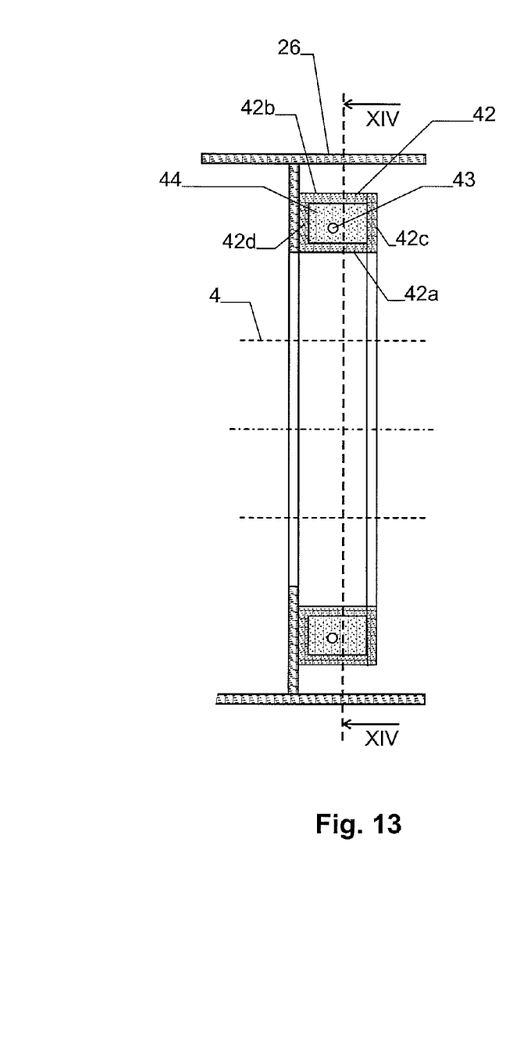
FIG. 13 is a sectional view of a third exemplary embodiment of a GCB.
Figure 14:
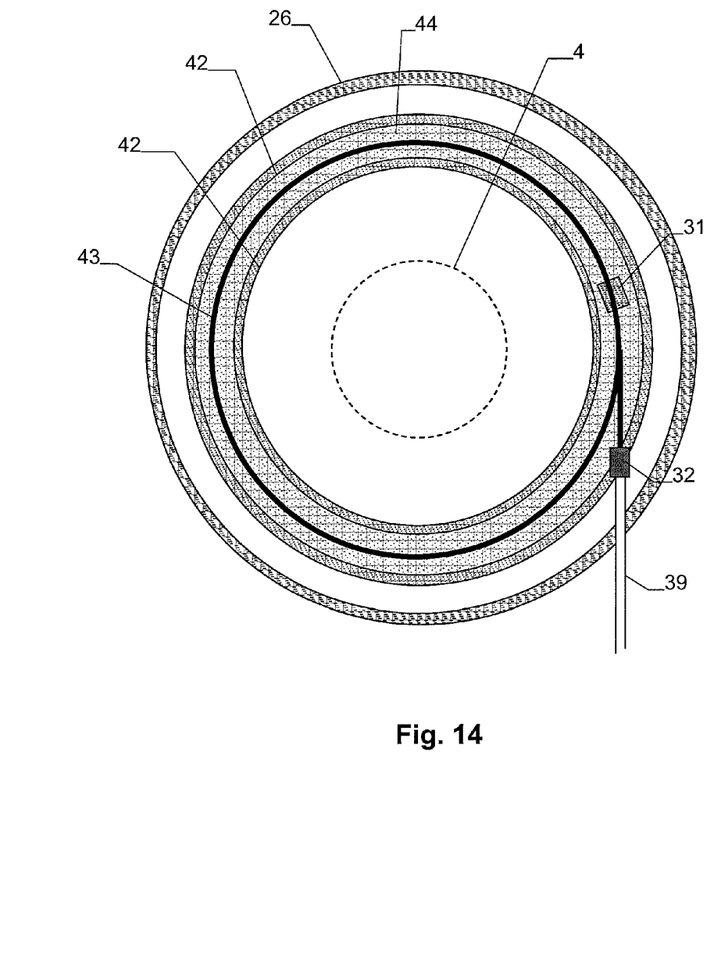
FIG. 14 is a sectional view along line XIV-XIV of FIG. 13.

Such an embodiment is shown in FIGS. 13, 14, wherein the ring-shaped housing extending around conductor 4 is designated by 42 and the fiber by 43. The housing has an inner wall 42a facing the conductor 4, an outer wall 42b facing outwards, as well as two axial walls 42c, 42d extending perpendicularly thereto, and it encloses an annular space for receiving the fiber 43 or a capillary enclosing the fiber 43. The space enclosed by housing 42 can optionally be filled with an embedding material 44.

It will be apparent to those skilled in the art that a capillary containing a non-annealed low birefringent sensing sensing fiber, a spun highly birefringent sensing fiber or a flint glass fiber may also be packaged in a rigid ring-shaped housing, i.e. without using a sensing strip. For example, the capillary or the fiber is then embedded in a soft material such as silicone gel or foam. The spun highly birefringent sensing fiber 43 and the flint glass fiber may be placed in the housing 42 without capillary and with or without any further embedding material 44.

For redundancy, the sensing strip 29 may contain two or more sensing fibers 7, each connected by a connecting fiber 16 to is own optoelectronics unit. Each sensing fiber 7 may be accommodated in a separate capillary as described above or a single capillary may contain two or more sensing fibers. For example, there is a common cable 39 for the connecting fibers 16. At the opto-electronics end of the cable the individual fibers 16 are fanned out to the individual opto-electronics units.

A further alternative is that there are two or more sensing strips of independent sensors mounted on a common support body 25.

A still further alternative is that two or more independent sensor heads are mounted at 5a, 3a.

Notes:

The design shown here provides several exemplary aspects of improvement:

It provides an installation concept of a fiber-optic current sensor in a GCB.

A sensor head arrangement at ground potential can be used to avoid the need of a high-voltage proof fiber link.

Alternatively, a sensor head arrangement at power line potential enables the application in a GCB without enclosure.

Methods of arranging and packaging the sensing fiber are described.

Methods of fiber packaging allowing an installation after GCB assembly and an easy retrofit installation is shown.

Current measurements are achieved with a lightweight fiber-optic sensor that does not require extra equipment (e.g. a crane) for installation.

A single sensing fiber coil for the whole current range can be used instead of using several cores as in known transformers.

A standardized sensor head is suitable for all specifications.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

References, all of which are incorporated herein by reference in their entireties:
1. WO 2005/111633
2. EP 1 154 278
3. K. Bohnert, G. Gabus, J. Nehring, and H. Brändle, "Temperature and vibration insensitive fiber-optic current sensor", J. of Lightwave Technology 20(2), 267-276 (2002).
4. K. Bohnert, H. Brändle, M. Brunzel, P. Gabus, and P. Guggenbach, "Highly accurate fiber-optic dc current sensor for the electro-winning industry", IEEE/IAS Transactions on Industry Applications 43(1), 180-187, 2007.
5. R. A. Bergh, H. C. Lefevre, and H. J. Shaw, "An overview of fiber-optic gyroscopes", J. Lightw. Technol., 2, 91-107, 1984.
6. "The fiber-optic gyroscope", Nerve Lefevre, Artech House, Boston, London, 1993.
7. R. I. Laming and D. N. Payne, "Electric current sensors employing spun highly birefringent optical fibers", J. Lightw. Technol., 7, no. 12, 2084-2094, 1989.
8. EP 1 512 981
9. K. Bohnert, P. Gabus, J. Nehring, H. Brändle, M. Brunzel, "Fiber-optic high current sensor for electrowinning of metals", Journal of Lightwave Technology, 25(11), 2007.
10. EP 1 115 000
11. K. Kurosawa, S. Yoshida, and K. Sakamoto, "Polarization properties of flint glass fiber", *J. Lightw. Technol.*, 13, (7), pp. 1378-1383, 1995.

REFERENCE NUMBERS 1 generator
2 transformer
3 generator circuit breaker, GCB
4 conductor
5 switch
6 current sensor
7 sensing fiber
8 optoelectronic module
10 light source
11 depolarizer
12 fiber coupler
13 phase modulator
14 90°-splice
15 polarization-maintaining fiber coupler
16 connecting fiber
17 quarter-wave retarder
18 reflector
20 enclosure
21 SF6 interrupting chamber
22 disconnector
23a, 23b locations of sensing head
24 flange
24a coupling
25 support body
26 cover
27 channel
28 foam strip
29 sensing strip
31 clamp
32 adapter
33 capillary
34 lubricant
35 silicone/resin
36 groove
37 support members
38 cover ring
39 cable of connecting fiber 16
40 fiber cable
41 seal
42 housing
42a-d housing walls
43 fiber or capillary with fiber
44 embedding material
45 adapter tube

What is claimed is:

1. A generator circuit breaker for being arranged between an electrical generator and a transformer, the generator circuit breaker comprising:

a conductor for carrying current of a generator;
a switch for interrupting said current; and
at least one current sensor for measuring a current in said conductor, wherein said current sensor includes an optical sensing fiber looped around said conductor, and an optoelectronic module for measuring said current in said sensing fiber via a Faraday effect;
a shock absorber to which the sensing fiber is mounted for absorbing shock when the switch is operated;
an enclosure, said sensing fiber being mounted, via said shock absorber, inside said enclosure; and
at least one flange extending inwards from said enclosure, wherein said sensing fiber is mounted to said flange, and a coupling for mounting the flange to the enclosure forms the shock absorber.

2. The generator circuit breaker of claim 1, wherein said enclosure has a rigid structure to which said sensing fiber is fixedly mounted via said shock absorber.

3. The generator circuit breaker of claim 2, wherein said sensing fiber is mounted, via said shock absorber, to an inner side of said enclosure.

4. The generator circuit breaker of claim 2, comprising:
an annular support body for mounting to the generator circuit breaker; and
a plurality of spaced-apart support members holding said sensing fiber at a distance from said support body.

5. The generator circuit breaker of claim 4, comprising:
an annular cover ring arranged coaxially to said support body, wherein said sensing fiber is located between said support body and said cover ring, and
wherein said support members extend at least between said support body and said cover ring.

6. The generator circuit breaker of claim 2, wherein said sensing fiber is a non-annealed fiber, an annealed fiber, a highly birefringent spun fiber, or a flint glass fiber.

7. The generator circuit breaker of claim 2, comprising:
several redundant sensing fibers.

8. The generator circuit breaker of claim 2, comprising:
a ring-shaped rigid housing extending around said conductor and containing the sensing fiber or a capillary with the sensing fiber.

9. An assembly comprising:
an electrical generator generating a first voltage; and
a transformer converting said first voltage to a second voltage; and
a generator circuit breaker of claim 2 arranged between said generator and said transformer.

10. The generator circuit breaker of claim 2, comprising:
at least one flange extending outwards from said conductor, wherein said sensing fiber is mounted to said flange.

11. The generator circuit breaker of claim 2, comprising:
a capillary for packaging said sensing fiber, said capillary being mounted in a flexible sensing strip.

12. The generator circuit breaker of claim 11, comprising:
a clamp holding a start section and an end section of said carrier strip.

13. The generator circuit breaker of claim 11, wherein said sensing strip holds a single sensing fiber and is wound several times around conductor.

14. The generator circuit breaker of claim 11, wherein said sensing strip forms a single loop around said conductor and contains several loops of sensing fiber.

15. The generator circuit breaker of claim 11, comprising:
an adapter mounted inside the enclosure of the generator circuit breaker for connecting the sensing strip to a fiber cable of a connecting fiber, which is arranged between the sensing fiber and the optoelectronic module.

16. The generator circuit breaker of claim 11, comprising:
a retarder for compensating a combined temperature dependence of a Verdet constant and of a thermal expansion of the sensing strip being larger than a thermal expansion of the sensing fiber.

17. A generator circuit breaker for being arranged between an electrical generator and a transformer, the generator circuit breaker comprising:
a conductor for carrying current of a generator;
a switch for interrupting said current; and
at least one current sensor for measuring a current in said conductor, wherein said current sensor includes an optical sensing fiber looped around said conductor, and an optoelectronic module for measuring said current in said sensing fiber via a Faraday effect;
a shock absorber to which the sensing fiber is mounted for absorbing shock when the switch is operated;
an annular support body for mounting to the generator circuit breaker; and
a foam strip mounted to said support body for placement between said support body and said sensing fiber,
wherein the foam strip forms the shock absorber.

18. The generator circuit breaker of claim 17, comprising:
an enclosure having a rigid structure inside which said sensing fiber is fixedly mounted via said shock absorber.

19. The generator circuit breaker of claim 18, comprising:
at least one flange extending outwards from said conductor, wherein said sensing fiber is mounted to said flange.

20. The generator circuit breaker of claim 18, comprising:
an annular support body for mounting to the generator circuit breaker; and
a plurality of spaced-apart support members holding said sensing fiber at a distance from said support body.

21. The generator circuit breaker of claim 20, comprising:
an annular cover ring arranged coaxially to said support body,
wherein said sensing fiber is located between said support body and said cover ring, and
wherein said support members extend at least between said support body and said cover ring.

22. The generator circuit breaker of claim 18, comprising:
a capillary for packaging said sensing fiber, said capillary being mounted in a flexible sensing strip.

23. The generator circuit breaker of claim 22, comprising:
a clamp holding a start section and an end section of said carrier strip.

24. The generator circuit breaker of claim 22, wherein said sensing strip holds a single sensing fiber and is wound several times around conductor.

25. The generator circuit breaker of claim 22, wherein said sensing strip forms a single loop around said conductor and contains several loops of sensing fiber.

26. The generator circuit breaker of claim 22, comprising:
an adapter mounted inside the enclosure of the generator circuit breaker for connecting the sensing strip to a fiber cable of a connecting fiber, which is arranged between the sensing fiber and the optoelectronic module.

27. The generator circuit breaker of claim 22, comprising:
a retarder for compensating a combined temperature dependence of a Verdet constant and of a thermal expansion of the sensing strip being larger than a thermal expansion of the sensing fiber.

28. The generator circuit breaker of claim 18, wherein said sensing fiber is a non-annealed fiber, an annealed fiber, a highly birefringent spun fiber, or a flint glass fiber.

29. The generator circuit breaker of claim 18, comprising:
several redundant sensing fibers.

30. The generator circuit breaker of claim 18, comprising:
a ring-shaped rigid housing extending around said conductor and containing the sensing fiber or a capillary with the sensing fiber.

31. The generator circuit breaker of claim 17, wherein said sensing fiber is mounted to an outer side of said conductor.

32. An assembly comprising:
an electrical generator generating a first voltage; and
a transformer converting said first voltage to a second voltage; and
a generator circuit breaker of claim 17 arranged between said generator and said transformer.

* * * * *